(12) United States Patent
Kobayashi

(10) Patent No.: US 7,132,789 B2
(45) Date of Patent: Nov. 7, 2006

(54) ORGANIC EL DEVICE, METHOD OF MANUFACTURING THE SAME AND ELECTRONIC APPARATUS

(75) Inventor: Hidekazu Kobayashi, Hara-mura (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/915,415

(22) Filed: Aug. 11, 2004

(65) Prior Publication Data

US 2005/0099118 A1 May 12, 2005

(30) Foreign Application Priority Data

| Aug. 18, 2003 | (JP) | ................................ 2003-294681 |
| Jul. 13, 2004 | (JP) | ................................ 2004-205929 |

(51) Int. Cl.
| H01J 1/62 | (2006.01) |
| H01J 63/04 | (2006.01) |
| H01J 9/00 | (2006.01) |
| B05D 5/06 | (2006.01) |

(52) U.S. Cl. ........................ 313/504; 313/506; 313/509; 427/66; 445/24

(58) Field of Classification Search ................ 313/504; 427/66
See application file for complete search history.

(56) References Cited

U.S. PATENT DOCUMENTS

| 4,356,429 | A | | 10/1982 | Tang ........................... 313/503 |
| 4,539,507 | A | | 9/1985 | VanSlyke et al. ........... 313/504 |
| 5,554,911 | A | * | 9/1996 | Nakayama et al. ......... 313/504 |
| 5,780,174 | A | * | 7/1998 | Tokito et al. ................ 313/506 |
| 6,133,692 | A | * | 10/2000 | Xu et al. .................... 313/504 |
| 6,147,451 | A | * | 11/2000 | Shibata et al. .............. 313/506 |
| 6,541,130 | B1 | * | 4/2003 | Fukuda ........................ 313/504 |
| 6,545,408 | B1 | * | 4/2003 | Uchida et al. .............. 313/504 |
| 6,680,570 | B1 | | 1/2004 | Roitman et al. ............ 313/506 |
| 6,791,261 | B1 | | 9/2004 | Shimoda et al. ............ 313/506 |

FOREIGN PATENT DOCUMENTS

| JP | 57-051781 | 3/1982 |
| JP | A-63-70257 | 3/1988 |

(Continued)

*Primary Examiner*—Nimeshkumar D. Patel
*Assistant Examiner*—Natalie K Walford
(74) *Attorney, Agent, or Firm*—Oliff & Berridge, PLC

(57) ABSTRACT

To provide an organic EL device which is capable of forming a minute optical resonator in a light-emitting element and improving the chromaticity of color light components to be emitted, without complicating a manufacturing process, a method of manufacturing the organic EL device, and an electronic apparatus. In an organic EL device 1, each element comprises an anode 4 and a first insulating layer 10a, a light-transmitting layer 13 having a refractive index larger than that of a transparent substrate 2, a cathode 7 having light reflection which oppose a transparent electrode 4, and an organic functional layer including a light-emitting layer 6 and a hole injecting layer 5. In green color light-emitting elements, a first optical length, which is the sum of the product of film thickness and refractive index of the hole injecting layer and the product of film thickness and refractive index of the light-emitting layer, is 250 nm or less, and in blue color light-emitting elements, a second optical length, which is the sum of the product of film thickness and refractive index of the hole injecting layer and the product of film thickness and refractive index of the light-emitting layer, is 230 nm or less. A third optical length, which is the product of film thickness and refractive index of the light-transmitting layer 13, is 300 nm or less.

4 Claims, 5 Drawing Sheets

FOREIGN PATENT DOCUMENTS

| | | |
|---|---|---|
| JP | A-63-175860 | 7/1988 |
| JP | A-2-135359 | 5/1990 |
| JP | A-2-135361 | 5/1990 |
| JP | A-2-209988 | 8/1990 |
| JP | A-3-37992 | 2/1991 |
| JP | A-3-152184 | 6/1991 |
| JP | A-6-275381 | 9/1994 |
| JP | A-7-282981 | 10/1995 |
| JP | A-2002-289358 | 10/2002 |
| JP | A-2002-299057 | 10/2002 |
| JP | 2003-528421 | 9/2003 |
| JP | 59-194393 | 11/2005 |

\* cited by examiner

ORGANIC EL DEVICE, METHOD OF MANUFACTURING THE SAME AND ELECTRONIC APPARATUS

BACKGROUND OF THE INVENTION

1. Field of Invention

The present invention relates to an organic electro-luminescent (EL) device having a plurality of light-emitting elements for emitting predetermined color light components on a transparent substrate, a method of manufacturing the organic EL device, and an electronic apparatus.

2. Description of Related Art

As a next generation display device, an organic EL device having a plurality of electroluminescent (EL) elements on a transparent substrate has been expected. The organic EL device has light-emitting elements in which an organic functional layer including a light-emitting layer is interposed between an anode and a cathode. In such an organic EL device, holes injected from the anode and electrons injected from the cathode are recombined in the light-emitting layer to emit light when deactivated from the excited state. Further, an EL device which increases light having a specified wavelength by using a minute optical resonator is disclosed (for example, see Patent Document 1).

[Patent Document 1] Japanese Unexamined Patent Application Publication No. 7-282981

SUMMARY OF THE INVENTION

A technique disclosed in Patent Document 1 aims to improve the chromaticity of emitted light components by allowing the specified wavelength among the emitted light components to be resonated. However, in the technique disclosed in Patent Document 1, when manufacturing a color display device using an EL element, since the optimized minute optical resonators must be provided in the respective pixels of red (R), green (G) and blue (B), there is a problem in that a manufacturing process becomes complicated along with increased manufacturing cost.

In consideration of the above problem, it is an object of the present invention to provide an organic EL device which is capable of forming a minute optical resonator in the light-emitting element and improving the chromaticity of color light components to be emitted without complicating the manufacturing process, a manufacturing method of the organic EL device, and an electronic apparatus.

In the organic EL device, a part of light is reflected in an interface between layers having different refractive indexes. Here, in the case in which a light-emitting element is formed by sequentially laminating a light-transmitting layer having a transparent electrode (anode), a hole injecting layer, a light-emitting layer, and a counter electrode (cathode) on a transparent substrate in this order, light generated in an interface between the hole injecting layer and the light-emitting layer is mainly divided into a first light component emitted directly from the transparent substrate, a second light component reflected by the counter electrode to be emitted from the transparent substrate, and a third light component reflected by the light-transmitting layer and in addition the electrode to be emitted from the transparent substrate. Accordingly, the first through third light components are simultaneously emitted from the transparent substrate, such that interference is caused.

Equation (1) described below represents a condition that light component after the interference is brighter than light component before the interference, given that light components having the same wavelength interfere with each other.

$$La = (1/2) \times m \times \lambda \, (m=0, 1, 2, \ldots) \tag{1}$$

In Equation (1), $\lambda$ is a wavelength, and La is an optical length.

Here, the optical length La is calculated by means of Equation (2) described below.

$$La = n \times d \tag{2}$$

In Equation (2), n is a refractive index and d is a thickness of a layer into which light is propagated.

As seen from Equation (1), by setting the optical length La to a predetermined value, it is possible to more brighten light component after the interference than light component before the interference, and further it is also possible to improve the chromaticity of light.

Accordingly, by setting the optical lengths La of the respective layers (light-transmitting layer, hole injecting layer and light-emitting layer) to allow the above-mentioned first through third light components to be brightened, it is possible to improve the chromaticity of light component emitted from the organic EL device. For example, if the optical length in the minute optical resonator provided between the light-transmitting layer and the electrode is set to be an integral multiple of a half wavelength ($\lambda/2$) of a desired light, it is possible to improve the chromaticity of light component emitted from the organic EL device.

The present invention has been made based on the above knowledge. In the present invention, there is provided an organic electroluminescent (EL) device comprising a plurality of light-emitting elements for emitting predetermined color light components on a transparent substrate, wherein each light-emitting element has a light-transmitting layer having at least a transparent electrode, an organic functional layer including a hole injecting layer and a light-emitting layer, and a counter electrode having optical reflectance which are sequentially laminated on a surface of the transparent substrate in this order, such that a minute optical resonator is provided between the light-transmitting layer and the counter electrode, and the light-transmitting layer further has a first insulating layer having a refractive index almost the same as that of the transparent electrode, between the transparent substrate and the transparent electrode.

In the present invention, since the minute optical resonator is provided between the light-transmitting layer and the counter electrode, color light components emitted from the respective light-emitting elements are respectively emitted from the transparent substrate with a light component of a specified wavelength being brightened. Thus, it is possible to improve the chromaticity of color light components emitted from the transparent substrate. Further, in the present invention, since the transparent electrode and the first insulating layer having a refractive index almost the same as that of the transparent electrode are used for the light-transmitting layer constituting the minute optical resonator, new layers for forming the minute optical resonator can be minimally provided. Thus, it is possible to form the minute optical resonator in the light-emitting element without complicating the manufacturing process and further it is possible to improve the chromaticity of color light components to be emitted. In addition, since the transparent electrode and the first insulating layer having a refractive index almost the same as that of the transparent electrode is included in the light-transmitting layer, it is possible to easily optimize the optical length of the light-transmitting layer by changing the film thickness of the first insulating layer, even though there is a limitation by which the film thickness of the transparent electrode cannot be changed. Further, since the first insulating layer has the refractive index almost the same as that of the transparent electrode, reflection of light in an interface of the transparent electrode and the first insulating layer almost never occurs. Also, since the first insulating layer is formed between the transparent substrate and the transparent electrode, it is possible to prevent an electrical short caused by the contact of the electronic circuits disposed on the transparent substrate and the transparent electrode.

In the present invention, the light-transmitting layers in the light-emitting elements for emitting different colors from each other are preferably made of the same material and have the same film thickness. The light-transmitting layer is formed by a semiconductor process such as a film-forming process or a photolithography process. Thus, if the light-transmitting layers in the light-emitting elements for emitting different colors from each other are made to have the same construction, it is possible to simultaneously form the light-transmitting layers with respect to the light-emitting elements for emitting different colors from each other. Consequently, the manufacturing process can be simplified.

In the present invention, the first insulating layer may be made of, for example, silicon nitride. Since the refractive index of silicon nitride can be changed according to the film-forming conditions, it is possible to make the first insulating layer and the transparent electrode to have almost the same refractive index, by adjusting the film-forming conditions.

In the present invention, between the transparent substrate and the light-transmitting layer, a second insulating layer having a refractive index almost the same as that of the transparent substrate preferably is provided. In such a construction, even when sufficient insulation cannot be obtained with only the film thickness of the first insulating layer, it is possible to effectively prevent an electrical short caused by the contact of the electronic circuits disposed on the transparent substrate and the transparent electrode. Further, since the second insulating layer has the refractive index almost equal to the refractive index of the transparent substrate, reflection of light in an interface of the second insulating layer and the transparent substrate almost never occurs.

In the present invention, the second insulating layer may be made of, for example, silicon oxide. Since the refractive index of silicon oxide can be changed according to the film-forming conditions, it is possible to make the second insulating layer and the transparent substrate to have almost the same refractive index, by adjusting the film-forming conditions.

In the present invention, in green light-emitting elements among the plurality of light-emitting elements, a first optical length, which is the sum of the product of film thickness and refractive index of the hole injecting layer and the product of film thickness and refractive index of the light-emitting layer, is 250 nm or less, and in blue light-emitting elements, a second optical length, which is the sum of the product of film thickness and refractive index of the hole injecting layer and the product of film thickness and refractive index of the light-emitting layer, is 230 nm or less. Further, the light-transmitting layer may have a refractive index larger than the refractive index of the transparent substrate, and a third optical length, which is the product of film thickness and refractive index of the light-transmitting layer, may be 300 nm or less.

As described above, if the optical length (the third optical length) of the light-transmitting layer is set to be 300 nm or less, if the optical length (the first optical length) of the organic functional layer (the hole injecting layer and the light-emitting layer) of the green light-emitting element arranged on the light-transmitting layer is set to be 250 nm or less, and if the optical length (the second optical length) of the organic functional layer (the hole injecting layer and the light-emitting layer) of the blue light-emitting element arranged on the light-transmitting layer is set to be 230 nm or less, color light components emitted from the respective light-emitting elements are respectively emitted from the transparent substrate with light component with a specified wavelength strengthened. Thus, it is possible to simultaneously improve the chromaticity of the green and blue light components emitted from the transparent substrate. Further, in the present invention, the optical lengths of the organic functional layers (the hole injecting layer and the light-emitting layer) are optimized for the green light-emitting element and the blue light-emitting element. Here, the organic functional layers in the green light-emitting element and the blue light-emitting element originally are formed with a different material by a separate process. As a result, even when the organic functional layers in the green light-emitting element and the blue light-emitting element are made to have different constructions, the manufacturing process is not complicated. In particular, when forming the organic functional layer by a liquid droplet discharging method, it is possible to make the optical lengths of the organic functional layers in the green light-emitting element and the blue light-emitting element different from each other, by making the amount of discharging of liquid droplets in the green light-emitting element and the blue light-emitting element. Therefore, it is possible to form the minute optical resonator in the light-emitting element without complicating the manufacturing process, and further it is also possible to improve the chromaticity of light to be emitted.

In the present invention, the plurality of light-emitting elements may further include red light-emitting elements. In such a construction, it is possible to display a full color image in the organic EL device. Here, since a sufficient chromaticity for a full color display has already been obtained from red light component to be emitted from the red light-emitting element, there is no need to further improve the chromaticity. Further, since red light component has a wavelength longer than the green light and the blue light, the chromaticity is not reduced even when the organic functional layer of the red light-emitting element is formed on the above-mentioned light-transmitting layer.

In the present invention, the film thickness of the transparent electrode is preferably 60 nm or less. If the film thickness of the transparent electrode is 60 nm or more, there is a tendency that the particle size becomes non-uniform, and the life span of the organic EL element is shortened. Thus, by setting the film thickness of the transparent electrode to be 60 nm or less, it is possible to extend the life span of the organic EL element, and further it is possible to improve the reliability of the organic EL device.

In the present invention, as the transparent electrode, indium tin oxide (ITO) or indium zinc oxide (IZO: Trademark) may be used.

In the present invention, in the case in which the organic EL device is constructed as an active matrix type, a thin film transistor corresponding to each of the plurality of light-emitting elements is formed on the transparent substrate. According to the active matrix type organic EL device, it is possible to improve light-emitting property, and thus display a high quality color image.

The organic EL device according to the present invention is used for an electronic apparatus such as cellular phone, a portable computer, a direct-view type display device, and various other color light sources. In particular, if the organic EL device according to the present invention is used for a display device of the electronic apparatus, it is possible to expand the display color range of the electronic apparatus.

In the present invention, there is provided a method of manufacturing an organic EL device comprising a plurality of light-emitting elements for emitting predetermined color light components on a transparent substrate, the method comprises a light-transmitting-layer forming step of forming a light-transmitting layer including at least a transparent electrode on the transparent substrate, an organic-functional-layer forming step of forming a functional layer corresponding to each light-emitting layer on the light-transmitting layer, and a counter-electrode forming step of forming a counter electrode made of a light-reflective material on the organic functional layer, the counter electrode and the light-transmitting layer constituting a minute resonator, wherein the light-transmitting-layer forming step comprises a process of forming a first insulating layer having a refractive index almost the same as that of the transparent electrode between the transparent substrate and the transparent electrode.

In the present invention, since the minute optical resonator is provided between the light-transmitting layer and the counter electrode, color light components emitted from the respective light-emitting elements are respectively emitted from the transparent substrate with a light component of a specified wavelength being brightened. Thus, it is possible to improve the chromaticity of color light components emitted from the transparent substrate. Further, in the present invention, since the transparent electrode and the first insulating layer having a refractive index almost the same as that of the transparent electrode are used for the light-transmitting layer constituting the minute optical resonator, new layers for forming the minute optical resonator can be minimally provided. Thus, it is possible to form the minute optical resonator in the light-emitting element without complicating the manufacturing process and further it is possible to improve the chromaticity of color light components to be emitted. In addition, since the transparent electrode and the first insulating layer having a refractive index almost the same as that of the transparent electrode is included in the light-transmitting layer, it is possible to easily optimize the optical length of the light-transmitting layer by changing the film thickness of the first insulating layer, even though there is a limitation by which the film thickness of the transparent electrode cannot be changed. Further, since the first insulating layer has the refractive index almost the same as that of the transparent electrode, reflection of light in an interface of the transparent electrode and the first insulating layer almost never occurs. Also, since the first insulating layer is formed between the transparent substrate and the transparent electrode, it is possible to prevent an electrical short caused by the contact of the transparent substrate and the transparent electrode.

In the present invention, in the light-transmitting-layer forming step, the light-transmitting layers in regions, where the light-emitting elements for emitting different color light components are formed, are preferably made of the same material and have the same film thickness. The light-transmitting layer is formed by a semiconductor process such as a film-forming process or a photolithography process. As a result, if the light-transmitting layers in the light-emitting elements for emitting different colors from each other are made to have the same construction, it is possible to simultaneously form the light-transmitting layers to the light emitting elements emitting different colors from each other. Consequently, the manufacturing process can be simplified.

In the present invention, in the organic-functional-layer forming step, in regions where green light-emitting elements are formed, a hole injecting layer and a light-emitting layer may be formed such that a first optical length, which is the sum of the product of film thickness and refractive index of the hole injecting layer and the product of film thickness and refractive index of the light-emitting layer, is 250 nm or less, and in regions where blue light-emitting elements are formed, a hole injecting layer and a light-emitting layer may be formed such that a second optical length, which is the sum of the product of film thickness and refractive index of the hole injecting layer and the product of film thickness and refractive index of the light-emitting layer, is 230 nm or less. Further, in the light-transmitting-layer forming step, the light-transmitting layer may be made of a material having a refractive index larger than a refractive index of the transparent substrate and may be formed such that a third optical length, which is the product of film thickness and refractive index of the light-transmitting layer, is 300 nm or less.

As described above, if the optical length (the third optical length) of the light-transmitting layer is set to be 300 nm or less, if the optical length (the first optical length) of the organic functional layer (the hole injecting layer and the light-emitting layer) of the green light-emitting element arranged on the light-transmitting layer is set to be 250 nm or less, and if the optical length (the second optical length) of the organic functional layer (the hole injecting layer and the light-emitting layer) of the blue light-emitting element arrange on the light-transmitting layer is set to be 230 nm or less, it is possible to simultaneously improve the chromaticity of the green and the blue light components to be emitted from the transparent substrate. Further, in the present invention, the optical lengths of the organic functional layers (the hole injecting layer and the light-emitting layer) of the light-emitting elements are optimized for the green light-emitting element and the blue light-emitting element. Here, since the organic functional layers in the green light-emitting element and the blue light-emitting element are originally formed with different materials by a separate process, the manufacturing process is not complicated, even when the organic functional layers in the green light-emitting element and the blue light-emitting element are made different from each other. In particular, when forming the organic functional layer by the liquid droplet discharging method, it is possible to make the optical lengths of the organic functional layers in the green light-emitting element and the blue light-emitting element different from each other, only by making the amount of discharging of liquid droplets in the green light-emitting element and the blue light-emitting element different. Also, it is possible to form the minute optical resonator in the light-emitting element without complicating the manufacturing process, and thus it is possible to improve the chromaticity of color light component to be emitted.

In the present invention, in the organic-functional-layer forming step, the hole injecting layer and the light-emitting layer are preferably formed by using a liquid droplet discharging method. The liquid droplet discharging method is used to form a pattern by discharging a liquid material through a discharging head of the liquid droplet discharging device, such that it is possible to form a certain layer in a certain region at a certain film thickness. Thus, according to the liquid droplet discharging method, the film thickness of the light-emitting layer and the film thickness of the hole injecting layer, that is, the optical lengths of the organic functional layers in the green light-emitting element and the blue light-emitting element can be easily made different from each other. Also, in the green light-emitting element and the blue light-emitting element, it is possible to easily set the optical lengths of the organic functional layer at an optimal value. Further, it is also possible to simultaneously and easily improve the chromaticity of the green and the blue light components to be emitted from the transparent substrate. Here, the discharging head of the liquid droplet discharging device comprises an ink jet head. An ink jet method may be a piezo jet method in which a liquid is discharged by changing the volume of a piezoelectric element, or a method in which an electrothermal converter is used for an energy generating element. Moreover, the liquid droplet discharging device may include a dispenser. Further, the liquid material means a medium having an appropriate viscosity to be discharged from a nozzle of the discharging head, irrespective of watery or oily nature. Here, it is necessary to have a proper liquidity (viscosity) capable of being discharged from the nozzle or the like, and to prepare a liquid having mixed with a solid material. Specifically, the solid material to be contained in the liquid material may be melted by heating above the melting point, or may be distributed in a solvent as particles. In addition, functional materials such as dyes or pigments other than the solvent may be added.

DETAILED DESCRIPTION OF PREFERRED EMBODIMENTS

An organic EL device and a manufacturing method thereof, and an electronic apparatus according to an embodiment of the present invention will now be described with reference to the drawings.

[Entire Construction of Organic EL Device]

Figure 1:
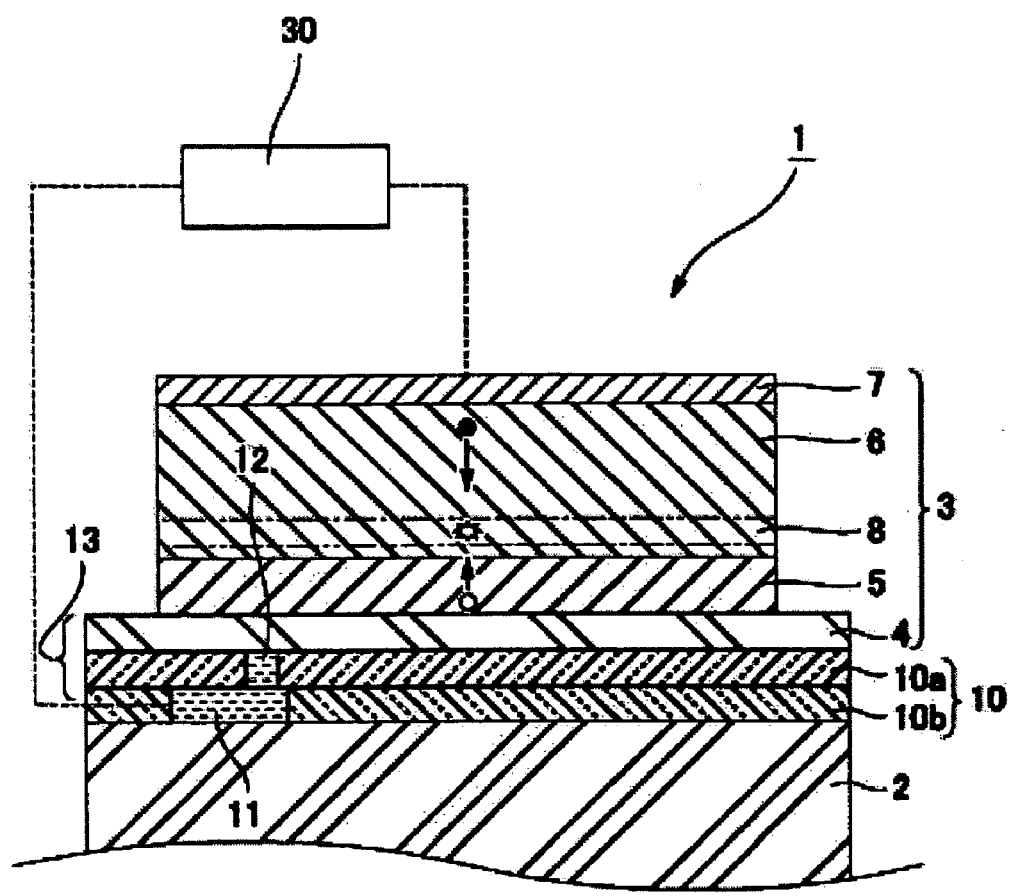
FIG. 1 is a schematic constructural view showing an organic EL device according to an embodiment of the present invention.

FIG. 1 is a schematic constructural view showing an embodiment of an organic EL device of the present invention. In FIG. 1, an organic EL device 1 is a so-called 'bottom emission type' organic EL device in which light component emitted from light-emitting elements (organic EL elements) is allowed to be emitted through a transparent substrate 2, and comprises a transparent substrate 2 such as a glass substrate and a light-emitting element 3 provided on one surface of the transparent substrate 2 with an insulating layer 10 interposed therebetween. In the present embodiment, the light-emitting element 3 comprises an anode 4 (transparent electrode) laminated on an insulating layer 10, a hole injecting layer 5 laminated on the anode 4, a light-emitting layer 6 laminated on the hole injecting layer 5, and a cathode 7 (counter electrode) laminated on the light-emitting layer 6.

In the present embodiment, the hole injecting layer 5 and the light-emitting layer 6 constitute an organic functional layer which is laminated between the anode 4 and the cathode 7. Further, the organic EL device 1 comprises a control device 30 for applying an electric field of a predetermined value to the light-emitting element 3 (light-emitting layer 6) via the anode 4 and the cathode 7, a TFT element 11 on the transparent substrate 2, and so on. The control device 30 is electrically connected to the anode 4 via the TFT element 11 and a contact hole 12.

The hole injecting layer 5 and the light-emitting layer 6 are formed with an organic electroluminescent material. The transparent substrate 2 has transmittance to light component emitted from the light-emitting layer 6. The anode 4 is a transparent electrode made of indium tin oxide having transmittance to light component emitted from the light-emitting layer 6.

The cathode 7 is a reflective electrode made of a metallic material, such as aluminum (Al), magnesium (Mg), gold (Au), silver (Ag), which has reflectance to light component emitted from the light-emitting layer 6. Moreover, between the cathode 7 and the light-emitting layer 6, lithium fluoride (LiF) or calcium (Ca) may be provided.

The insulating layer 10 is intended to prevent an electrical short caused by the contact of the anode 4 and the transparent substrate 2, and is formed by laminating a first insulating layer 10a disposed at the side of the anode 4 and a second insulating layer 10b disposed at the side of the transparent substrate 2. The first insulating layer 10a is made of silicon nitride having a refractive index n1 almost the same as that of the anode 4. Since the refractive index of silicon nitride can be changed according to the film-forming conditions, it is possible to make the first insulating layer 10a and the anode 4 to have almost the same refractive index by adjusting the film-forming conditions. The second insulating layer 10b is made of silicon oxide having a refractive index n2 almost the same as that of the transparent substrate 2. Since the refractive index of silicon oxide can be changed according to the film-forming conditions, it is possible to make the second insulating layer 10b and the transparent substrate 2 to have almost the same refractive index by adjusting the film-forming conditions.

In the present invention, the anode 4 and the first insulating layer 10a have almost the same refractive index n1 respectively, and now, the anode 4 and the first insulating layer 10a constitute the light-transmitting layer 13. Here, a refractive index of the light-transmitting layer 13 is larger than the refractive index of the transparent substrate 2.

In such an organic EL device 1, if an electric field of a predetermined value, herein, a predetermined voltage is applied to the light-emitting element 3 via the anode 4 and the cathode 7 from the control unit 30, holes are injected into the light-emitting layer 6 from the anode 4 via the hole injecting layer 5, and electrons are injected into the light-emitting layer 6 from the cathode 7. And then, the holes injected from the anode 4 and the electrons injected from the cathode 7 are recombined in vicinities of an interface of the light-emitting layer 6 and the hole injecting layer 5, and peripheral molecules within the light-emitting layer 6 are excited by the energy generated from recombining, such that the differential energy is emitted as light when the molecules in the excited state are deactivated to the grounded state. In FIG. 1, a region in which the holes and the electrons within the light-emitting layer 6 are recombined is represented as a light-emitting region 8.

[Construction of Minute Optical Resonator]

Figure 2:
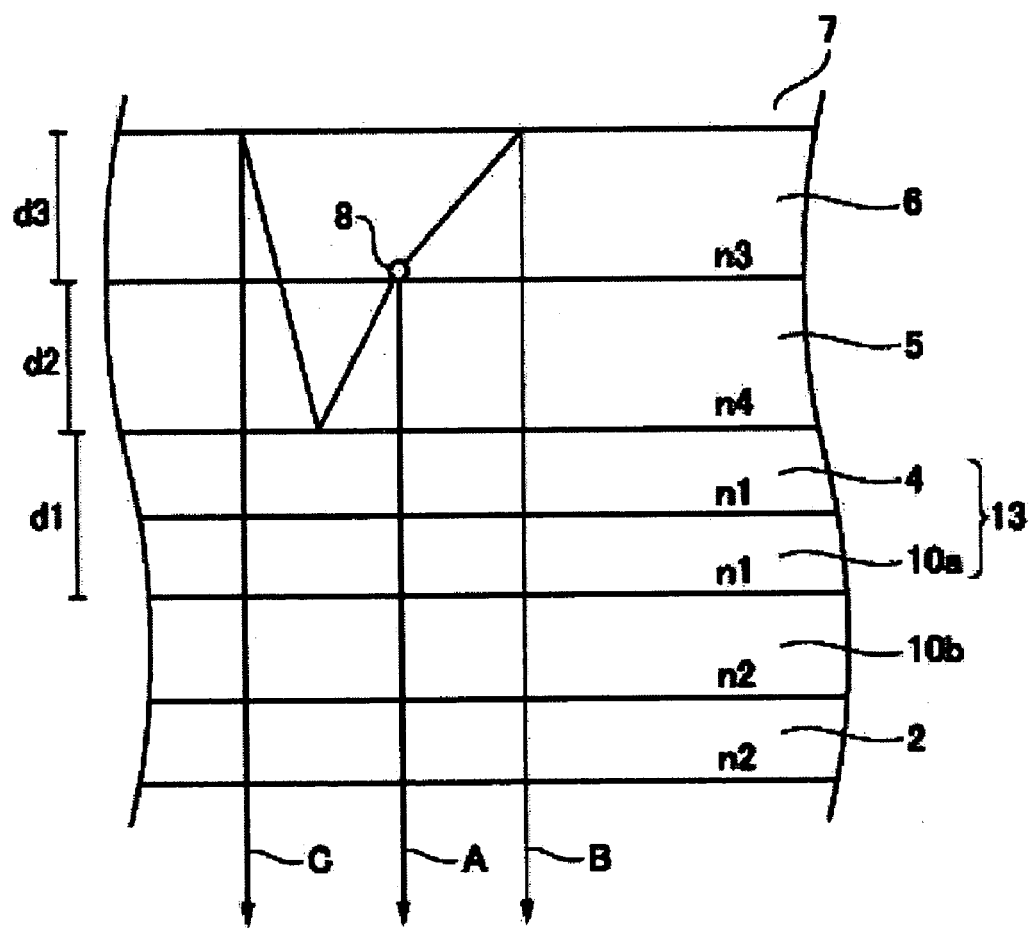
FIG. 2 is a schematic view for explaining an interference state of light emitting from light-emitting regions.
Figure 3:
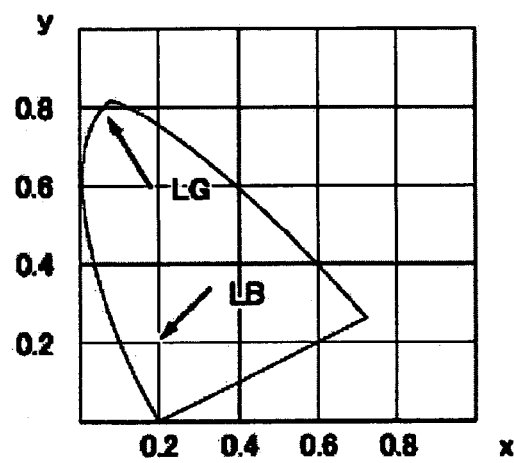
FIG. 3 is an explanatory view of the CIE-XY the chromaticity diagram.

FIG. 2 is a view for explaining an interference state of light component emitted from the light-emitting region 8 in the organic EL device 1 to which the present invention is applied. FIG. 3 is an explanatory view of the CIE-XY the chromaticity diagram. Moreover, in FIG. 2, for the purpose of explanation, reflection angles of light components are made to be different.

As shown in FIG. 2, light components emitted from the light-emitting region 8 are mainly divided into a first light component A which is emitted directly to the transparent substrate 2, a second light component B which is reflected by the cathode 7 and emitted from the transparent substrate 2, and a third light component C which is first reflected at the interface of the light-transmitting layer 13 and the hole injecting layer 5, and is reflected again by the cathode 7 and emitted from the transparent substrate 2. In addition, there is, for example, a light component which is sequentially reflected by the cathode 7, the light-transmitting layer 13 and again by the cathode 7 to be emitted from the transparent substrate 2. However, since light components other than light components A through C have a low intensity, there is no need to take them into consideration here.

Here, since the minute optical resonator is constructed between the light-transmitting layer 13 and the cathode 7, light component from emitted from the organic EL device 1 has a spectrum different from the resulting light component emitted by an interference of the first light component A, the second light component B and the third light component C. That is, in an interface of the first insulating layer 10a and the second insulating layer 10b, a light component having a wavelength at which phases of the light components A, B and C coincide has high transmittance from the first insulating layer 10a to the second insulating layer 10b, while a light component having a wavelength at which phases of the light components A, B and C do not coincide has low transmittance. Thus, if the minute optical resonator is provided between the light-transmitting layer 13 and the cathode 7 based on the above-mentioned Equations (1) and (2), the chromaticity of light component emitted from the organic EL device can be improved.

Further, in the case in which the light-emitting layer 6 is a green light-emitting layer in the organic EL device 1, that is, the light-emitting element 3 is constructed as a green light-emitting element, a film thickness d2 of the hole injecting layer 5 and/or the film thickness d3 of the light-emitting layer 6 is set such that a first optical length La1, which is the sum of the product of film thickness d2 and refractive index n4 of the hole injecting layer 5 and the product of film thickness d3 and refractive index n3 of the light-emitting layer 6, is 250 nm or less.

In contrast, in the case in which the light-emitting layer 6 is a blue light-emitting layer, that is, the light-emitting element 3 is constructed as a blue light-emitting element, the film thickness d2 of the hole injecting layer 5 and/or the film thickness d3 of the light-emitting layer 6 is set such that a second optical length La2, which is the sum of the product of film thickness d2 and refractive index n4 of the hole injecting layer 5 and the product of film thickness d3 and refractive index n3 of the light-emitting layer 6, is 230 nm or less.

Further, in the present embodiment, even when the light-emitting layer 6 is the green light-emitting layer or the blue light-emitting layer, the film thickness d1 of the light-transmitting layer 13 is set such that a third optical length La3, which is the product of film thickness d1 and refractive index n1 of the light-transmitting layer 13, is 300 nm or less.

As described above, in the present embodiment, since the anode 4 and the first insulating layer 10a having the refractive index almost the same as that of the anode 4 are used in the light-transmitting layer 13 constituting the minute optical resonator, new layers for forming the minute optical resonator can be minimally provided. Thus, it is possible to form the minute optical resonator in the respective light-emitting elements without complicating the manufacturing process.

Further, since the respective optical lengths La1, La2 and La3 are set, in the interface of the first insulating layer 10a and the second insulating layer 10b of each of the green and blue light-emitting elements, the phases of the light components A, B and C coincide at a wavelength which raises the chromaticity, and thus the transmittance of the light components having the wavelengths is selectively increased. For this reason, the chromaticity of light component emitted from the substrate 2 of the organic EL device is improved.

Further, in the present embodiment, the third optical length La3 is set to be 300 nm or less by adjusting the film thickness d1 of the light-transmitting layer 13. Here, in order to adjust the film thickness d1 of the light-transmitting layer 13, the film thickness of the anode 4 or the first insulating layer 10a may be adjusted. However, if the film thickness of the anode 4 made of ITO exceeds 60 nm, a particle size becomes non-uniform, and the life span of the organic EL device is shortened. Thus, it is preferable to set the film thickness of the anode 4 to be 60 nm or less. For this reason, it is preferable to adjust the film thickness d1 of the light-transmitting layer 13 by adjusting the film thickness of the first insulating layer 10a. For example, when the refractive index n1 of the light-transmitting layer 13 is 1.9, in order to set the third optical length La3 to be 300 nm or less, the film thickness d1 of the light-transmitting layer 13 is set to be about 150 nm. Accordingly, the film thickness of the anode 4 may be set to be about 50 nm, and the film thickness of the first insulating layer 10a may be set to be about 100 nm.

Further, in the present embodiment, the light-transmitting layer 13 is made of the same material and has the same film thickness as those of the green light-emitting element and the blue light-emitting element. Further, the first optical length La1 and the second optical length La2 of the minute optical resonator constructed between the light-transmitting layer 13 and the cathode 7 are corrected by adjusting the film thickness of the organic functional layer (the hole injecting layer 5 and the light-emitting layer 6) of each of the green light-emitting element and the blue light-emitting element. Here, since the light-transmitting layer 13 is formed by a semiconductor process such as film-forming process or photolithography process, the manufacturing process can be simplified if the light-transmitting layers 13 are formed with the same construction in the green light-emitting element and the blue light-emitting element.

The organic functional layers are formed with a different material and process in the green light-emitting element and the blue light-emitting element. Thus, even when the organic functional layers are formed to have a different film thickness in the green light-emitting element and the blue light-emitting element, the manufacturing process is not complicated.

In particular, in the case in which the organic functional layer (the hole injecting layer 5 and the light-emitting layer 6) is formed by using a liquid droplet discharging method, the discharging amount of liquid droplets can be set different when constituting the green light-emitting element and the blue light-emitting element. As a result, it is possible to easily adjust the film thicknesses of the hole injecting layer 5 and the light-emitting layer 6 in each light-emitting element, such that it is possible to easily optimize the optical length of the minute optical resonator in each light-emitting element. For example, in the case in which the refractive index n4 of the hole injecting layer 5 is 1.55, and the refractive index n3 of the light-emitting layer 6 is 1.8, it is possible to set the film thickness d2 of the hole injecting layer 5 to be an optimal thickness of 60 nm and set the film thickness d3 of the light-emitting layer 6 to be an optimal thickness of about 60 nm.

Further, the organic EL device 1 according to the present embodiment comprises a second insulating layer 10b having a refractive index almost the same as that of the transparent substrate 2 between the light-transmitting layer 13 and the transparent substrate 2. The first insulating layer 10a cannot be over a certain thickness under a limitation in which the third optical length La3 of the light-transmitting layer 13 should be 300 nm or less. Hence, the first insulating layer 10a is not thick enough to secure a sufficient insulation between the anode 4 and the transparent substrate 2 on which TFT arrays or electronic circuits are formed. However, in the present embodiment, since the second insulating layer 10b is formed between the light-transmitting layer 13 and the transparent substrate 2, it is possible to secure a sufficient insulation between the anode 4 and the transparent substrate 2 on which TFT arrays or electronic circuits are formed.

Moreover, from a view of securing a sufficient insulation between the anode 4 and the transparent substrate 2 on which TFT arrays or electronic circuits are formed, the film thickness of the second insulating layer 10b is preferably adjusted such that the film thickness of the insulating layer 10 is set to be 200 nm or more. Accordingly, it is possible to secure a sufficient insulation between the anode 4 and the transparent substrate 2 on which TFT arrays or electronic circuits are formed, and further it is possible to prevent the light components A through C from being reflected in an interface of the second insulating layer 10b and the transparent substrate 2.

EXPERIMENTAL EXAMPLE 1

First, the TFT element 11 was provided on the transparent substrate 2, and thereon the second insulating layer 10b made of silicon oxide was formed. Next, the anode 4 made of ITO was laminated on the second insulating layer 10b, the hole injecting layer 5 made of polyethylenedioxythiophene (PEDOT) was laminated on the anode 4 by using the liquid droplet discharging method, and the light-emitting layer 6 made of green light-emitting material was laminated on the hole injecting layer 5 by using the liquid droplet discharging method. Subsequently, the cathode 7 was formed on the light-emitting layer 6 while sealing with a sealing material. In the present example, since the first insulating layer 10a is not formed, the light-transmitting layer 13 comprises only the anode 4. However, even though the light-transmitting layer 13 comprises the anode 4 and the first insulating layer 10a, the same results can be obtained if the optical length of the light-transmitting layer 13 is the same.

In the present example, as shown by the sample number No. 1G in Table 1, the refractive index n1 of the light-transmitting layer 13 is 1.9, the refractive index n3 of the light-emitting layer 6 is 1.7, and the refractive index n4 of the hole injecting layer 5 is 1.55. Further, the film thickness d1 of the light-transmitting layer 13 is 150 nm, the film thickness d2 of the hole injecting layer 5 is 60 nm, and the film thickness d3 of the light-emitting layer 6 is 80 nm. Thus, the first optical length La1 becomes 229 nm, and the third optical length La3 becomes 285 nm.

TABLE 1

| SAMPLE NUMBER | HOLE INJECTING LAYER 5 REFRACTIVE INDEX n4 = 1.55 | | GREEN LIGHT-EMITTING LAYER 6 REFRACTIVE INDEX n3 = 1.7 | | | LIGHT-TRANSMITTING LAYER 13 REFRACTIVE INDEX n1 = 1.9 | | THE CHROMATICITY | |
|---|---|---|---|---|---|---|---|---|---|
| | FILM THICKNESS d2 | OPTICAL LENGTH | FILM THICKNESS d3 | OPTICAL LENGTH | FIRST OPTICAL LENGTH La1 | FILM THICKNESS d1 | THIRD OPTICAL LENGTH La3 | THE CHROMATICITY x | THE CHROMATICTY Y |
| NO. 1G | 60 nm | 93 nm | 80 nm | 136 nm | 229 nm | 150 nm | 285 nm | 0.4248 | 0.5554 |
| NO. 2G | 60 nm | 93 nm | 80 nm | 136 nm | 229 nm | 250 nm | 475 nm | 0.4344 | 0.5481 |
| NO. 3G | 60 nm | 93 nm | 80 nm | 136 nm | 229 nm | 350 nm | 665 nm | 0.4461 | 0.5793 |
| NO. 4G | 60 nm | 93 nm | 100 nm | 170 nm | 263 nm | 150 nm | 285 nm | 0.4364 | 0.5483 |
| NO. 5G | 60 nm | 93 nm | 100 nm | 170 nm | 263 nm | 250 nm | 475 nm | 0.4572 | 0.5289 |
| NO. 6G | 60 nm | 93 nm | 100 nm | 170 nm | 263 nm | 350 nm | 665 nm | 0.4741 | 0.5568 |
| NO. 7G | 60 nm | 93 nm | 120 nm | 204 nm | 297 nm | 150 nm | 285 nm | 0.4034 | 0.5395 |
| NO. 8G | 60 nm | 93 nm | 120 nm | 204 nm | 297 nm | 250 nm | 475 nm | 0.4302 | 0.5139 |
| NO. 9G | 60 nm | 93 nm | 120 nm | 204 nm | 297 nm | 350 nm | 665 nm | 0.4607 | 0.5295 |

For the sample number No. 1G shown in Table 1, the chromaticity of green light component emitted from the transparent substrate 2 in the organic EL device 1 according to the present example was measured. As a result, coordinates (x, y) in a XY the chromaticity diagram prescribed by the CIE (Commission Internationale de l'Eclairage/commission International on Illumination) was (0.4248, 0.5554).

Further, as shown in Table 1, as comparative examples to the present experimental example 1, when the film thickness d1 of the light-transmitting layer 13 was set to be 250 nm (the third optical length La3: 475 nm) and 350 nm (the third optical length La3: 665 nm), and the film thickness d3 of the light-emitting layer 6 was set to be 100 nm (the first optical length La1: 263 nm) and 120 nm (the first optical length La1: 297 nm), coordinates (x, y) in the CIE-XY chromaticity diagram are measured. In Table 1, the result measured for the respective comparative examples (sample numbers No. 2G through No. 9G) is also shown. In the respective comparative examples, the light-transmitting layer 13 having the film thickness d1 of 250 nm comprises ITO having the film thickness of 50 nm and silicon nitride having the film thickness of 200 mm. Further, the light-transmitting layer 13 having the film thickness d1 of 350 nm comprises ITO of the film thickness having 150 nm and silicon nitride having the film thickness of 200 nm.

In such an estimation, as represented by a solid line LG in the XY chromaticity diagram of FIG. 3, the value of the chromaticity x decreases and the value of the chromaticity y increases, such that the chromaticity of the green light is improved. The present inventors also carried out various experiments other than the present example. As a result, if the third optical length La3 is set to be 300 nm or less and the first optical length La1 is set to be 250 nm or less, like the present example 1, it was confirmed that the chromaticity of the green light component was improved. Moreover, if the first optical length La1 is set to be 150 nm or less, the intensity of light component emitted from the substrate 2 is largely decreased. Further, if the third optical length La3 is set to be 150 nm or less, it was seen that the value of the chromaticity y became small, and then the chromaticity is decreased, which resulted in decreasing the intensity of light.

EXPERIMENTAL EXAMPLE 2

First, the TFT element 11 was provided on the transparent substrate 2, and thereon the second insulating layer 10b made of silicon oxide was formed. Next, the anode 4 made of ITO was laminated on the second insulating layer 10b, the hole injecting layer 5 made of polyethylenedioxythiophene (PEDOT) was laminated on the anode 4 by using the liquid droplet discharging method, and the light-emitting layer 6 made of blue light-emitting material was laminated on the hole injecting layer 5 by using the liquid droplet discharging method. Subsequently, the cathode 7 was formed on the light-emitting layer 6 while sealing with a sealing material. In the present example, since the first insulating layer 10a is not formed, the light-transmitting layer 13 comprises only the anode 4. However, even though the light-transmitting layer 13 comprises the anode 4 and the first insulating layer 10a, the same results can be obtained if the optical length of the light-transmitting layer 13 is the same.

In the present example, as shown by the sample number No. 1B in Table 2, the refractive index n1 of the light-transmitting layer 13 is 1.9, the refractive index n3 of the light-emitting layer 6 is 1.8, and the refractive index n4 of the hole injecting layer 5 is 1.55. Further, the film thickness d1 of the light-transmitting layer 13 is 150 nm, the film thickness d2 of the hole injecting layer 5 is 60 nm, and the film thickness d3 of the light-emitting layer 6 is 60 nm. Thus, the second optical length La2 becomes 201 nm, and the third optical length La3 becomes 285 nm.

TABLE 2

| SAMPLE NUMBER | HOLE INJECTING LAYER 5 REFRACTIVE INDEX n4 = 1.55 | | BLUE LIGHT-EMITTING LAYER 6 REFRACTIVE INDEX n3 = 1.8 | | SECOND OPTICAL LENGTH La2 | LIGHT-TRANSMITTING LAYER 13 REFRACTIVE INDEX n1 = 1.9 | | THE CHROMATICITY | |
|---|---|---|---|---|---|---|---|---|---|
| | FILM THICKNESS d2 | OPTICAL LENGTH | FILM THICKNESS d3 | OPTICAL LENGTH | | FILM THICKNESS d1 | THIRD OPTICAL LENGTH La3 | THE CHROMATICITY x | THE CHROMATICTY Y |
| NO. 1B | 60 nm | 93 nm | 60 nm | 108 nm | 201 nm | 150 nm | 285 nm | 0.1698 | 0.215 |
| NO. 2B | 60 nm | 93 nm | 60 nm | 108 nm | 201 nm | 250 nm | 475 nm | 0.1769 | 0.2288 |
| NO. 3B | 60 nm | 93 nm | 60 nm | 108 nm | 201 nm | 350 nm | 665 nm | 0.1706 | 0.2548 |
| NO. 4B | 60 nm | 93 nm | 90 nm | 162 nm | 255 nm | 150 nm | 285 nm | 0.1827 | 0.2836 |
| NO. 5B | 60 nm | 93 nm | 90 nm | 162 nm | 255 nm | 250 nm | 475 nm | 0.1956 | 0.2764 |
| NO. 6B | 60 nm | 93 nm | 90 nm | 162 nm | 255 nm | 350 nm | 665 nm | 0.2009 | 0.2878 |
| NO. 7B | 60 nm | 93 nm | 120 nm | 216 nm | 309 nm | 150 nm | 285 nm | 0.1977 | 0.2988 |
| NO. 8B | 60 nm | 93 nm | 120 nm | 216 nm | 309 nm | 250 nm | 475 nm | 0.1966 | 0.2669 |
| NO. 9B | 60 nm | 93 nm | 120 nm | 216 nm | 309 nm | 350 nm | 665 nm | 0.2077 | 0.2566 |

On the sample number No. 1B shown in the Table 2, the chromaticity of blue light component emitted from the transparent substrate 2 in the organic EL device 1 according to the present example was measured. As a result, coordinates (x, y) in the CIE-XY chromaticity diagram was (0.1698, 0.2150).

Further, as shown in Table 2, as comparative examples to the present experimental example 2, when the film thickness d1 of the light-transmitting layer 13 was set to be 250 nm (the third optical length La3: 475 nm) and 350 nm (the third optical length La3: 665 nm), and the film thickness d3 of the light-emitting layer 6 was set to be 90 nm (the second optical length La2: 255 nm) and 120 nm (the second optical length La2: 309 nm), coordinates (x, y) in the CIE-XY chromaticity diagram are measured. In Table 2, the result measured for the respective comparative examples (sample numbers No. 2B through No. 9B) is also shown. In the respective comparative examples, the light-transmitting layer 13 having the film thickness d1 of 250 mm comprises ITO having the film thickness of 50 nm and silicon nitride having the film thickness of 200 nm. Further, the light-transmitting layer 13 having the film thickness d1 of 350 nm is made of ITO having the film thickness of 150 nm and silicon nitride having the film thickness of 200 nm.

In such an estimation, as represented by a solid line LB in the XY chromaticity diagram of FIG. 3, the value of the chromaticity x and the value of the chromaticity y decrease, such that the chromaticity of the blue light is improved. The present inventors also carried out various experiments other than the present example. As a result, if the third optical length La3 is set to be 300 nm or less and the second optical length La2 is set to be 230 nm or less, like the present example 2, it was confirmed that the chromaticity of the blue light was improved. Moreover, if the second optical length La2 is set to be 150 nm or less, the intensity of light component emitted from the substrate 2 is largely decreased. Further, if the third optical length La3 is set to be 150 nm or less, it was also seen that the intensity of light is largely decreased.

[Specific Construction of Organic EL Device]

Figure 4:
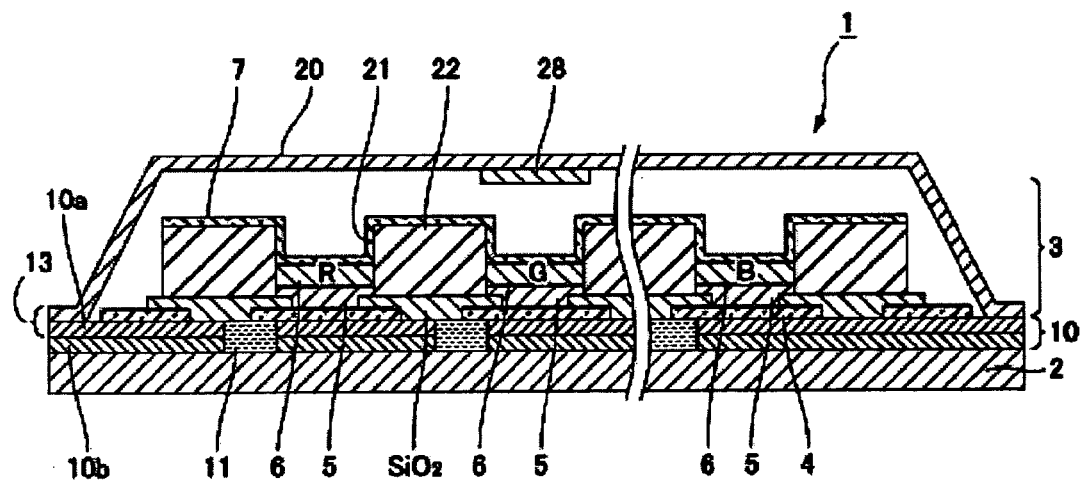
FIG. 4 is a schematic constructural view showing an example of an organic EL device.
Figure 5:
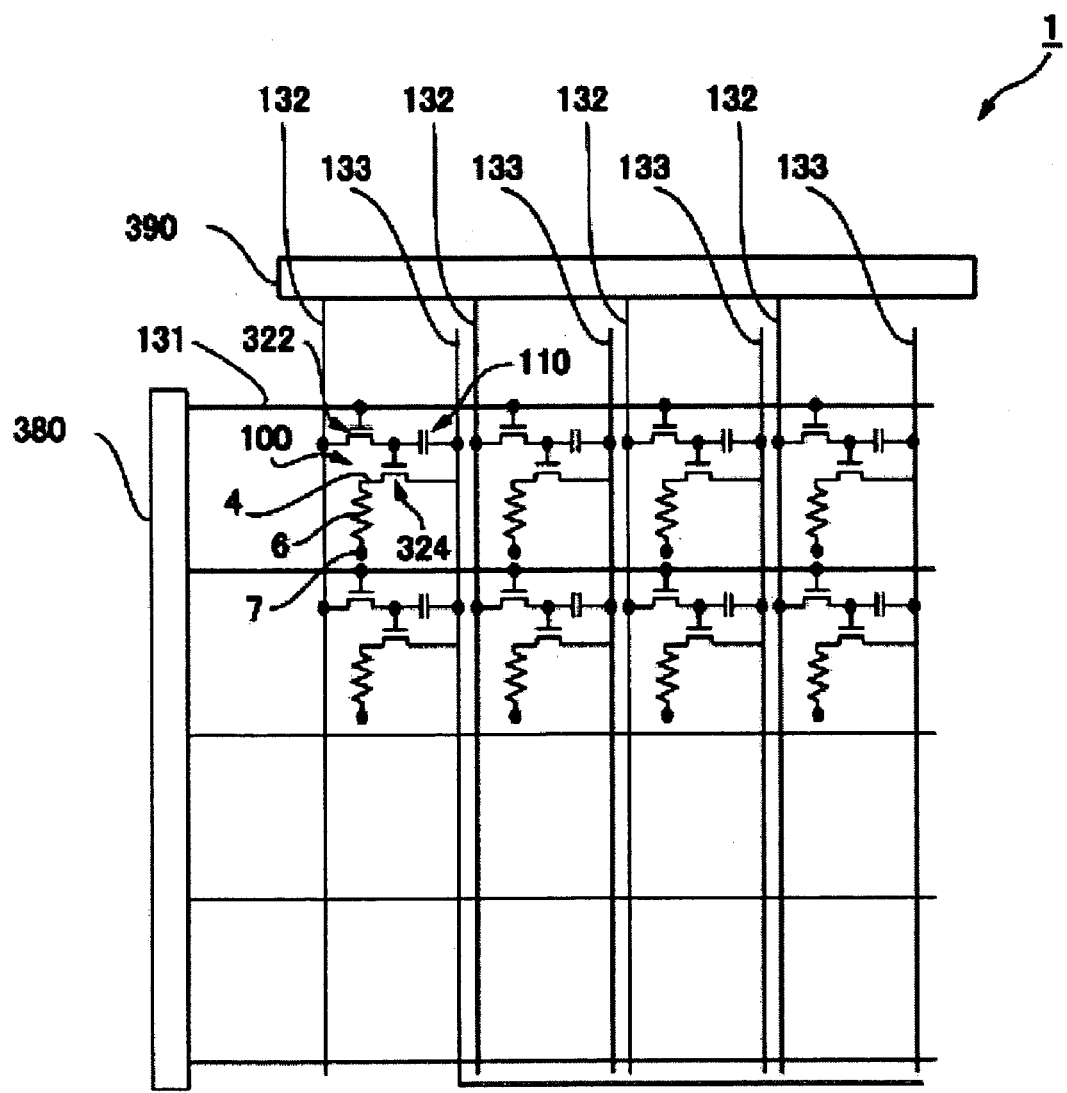
FIG. 5 is an equivalent circuit diagram showing an electrical construction of an active matrix type display device.

With reference to FIGS. 4 and 5, a specific construction of an organic EL device will be described. FIG. 4 is a schematic constructional view showing an example of an organic EL device to which the present invention is applied. FIG. 5 is an equivalent circuit diagram showing an electrical construction of an active matrix type organic EL device.

In FIG. 4, the organic EL device 1 comprises the transparent substrate 2 capable of transmitting light, the organic EL element (the light-emitting element) 3 provided on one surface of the transparent substrate 2 including the hole injecting layer 5 and the light-emitting layer 6 made of an organic electroluminescent material interposed between a pair of electrodes (the anode 4 and the cathode 7) with the insulating layer 10 interposed therebetween, the thin film transistor TFT 11 as a switching element provided on a surface of the transparent substrate 2 and connected to the anode 4, and a sealing substrate 20. The light-emitting layer 6 comprises light-emitting layers of three colors of red (R), green (G) and blue (B). Further, the sealing substrate 20 and the transparent substrate 2 are adhered with an adhesive layer, and the organic EL element 3 is sealed by means of the sealing substrate 20 and the adhesive layer.

Here, the organic EL device 1 shown in FIG. 4 is a bottom emission type or substrate side light-emitting type device, in which the light component emitted from the light-emitting layer 6 is taken out from the transparent substrate 2 to the outside of the device.

A forming material of the transparent substrate 2 includes a transparent or translucent material capable of transmitting light such as transparent glass, quartz, sapphire or a transparent synthetic resin such as polyester, polyacrylate, polycarbonate, and polyeterketone. In particular, as the forming material of the transparent substrate 2, cheap glass can be suitably used.

The insulating layer 10 is made of a laminated structure of the first insulating layer 10a and the second insulating layer 10b. Here, the first insulating layer 10a can be made of silicon nitride, and the second insulating layer 10b can be made of silicon oxide.

The anode 4 is a transparent electrode made of indium tin oxide (ITO) or indium zinc oxide (IZO: Trademark), such that it is capable of transmitting light. The hole injecting layer 5 can be made of a high molecular material such as polythiophene, polystyrenesulfonate, polypyrrole, polyaniline and their derivates. Further, in the case of using a low molecular material, it is preferable to form by laminating the hole injecting layer and the hole transporting layer. In this case, a forming material of the hole injecting layer may include copper phthalocyanine (CuPc), or polyphenylenevinylene such as polytetrahydrothiophenylphenylene, 1,1-bis-(4-N,N-ditolylaminophenyl)cyclohexane, or tris(8-hydroxyquinolinol)aluminum. Here, in particular, it is preferable to use copper phthalocyanine (CuPc).

As a forming material of the light-emitting layer 6, high molecular light emitters or low molecular organic light-emitting pigments, that is, various fluorescent materials or phosphorous materials can be used. Among conjugated high molecules for the light-emitting materials, it is particularly preferable to include arylenevinylene or polyfluorene structure. As the low molecular organic light-emitting pigments, naphthalene derivatives, anthracene derivatives, perylene derivatives, polymethine-based, xanthene-based, coumarin-based, and cyanine-based pigments, metal complex of 8-hydroquinoline and its derivatives, aromatic amine, tetraphenylcyclopentadiene derivatives, or known materials described in Japanese Unexamined Patent Application Publication Nos. 57-51781 and 59-194393 can be used. The cathode 7 may include a metal electrode made of calcium (Ca), aluminum (Al) or magnesium (Mg), gold (Au), silver (Ag).

Moreover, if necessary, an electron transporting layer or an electron injecting layer may be provided between the cathode 7 and the light-emitting layer 6. A forming material of the electron transporting layer is not limited particularly, but may include metal complex of oxaldiazole derivatives, antraquinodimethane and its derivatives, benzoquinone and its derivatives, naphthoquinone and its derivatives, antraquinone and its derivatives, tetracyanoanthraquinodimethane and its derivatives, fluorenone derivatives, diphenyldicyanoethylene and its derivatives, diphenoquinone derivatives, 8-hydroxyquinoline and its derivatives. More specifically, like the forming material of the above-mentioned hole transporting layer, it may include materials described in Japanese Unexamined Patent Application Publication Nos. 63-70257, 63-175860, 2-135359, 2-135361, 2-209988, 3-37992 and 3-152184. In particular, 2-(4-biphenyl)-5-(4-t-butylphenyl)-1, 3,4-oxadiazole, benzoquinone, antraquinone, or tris(8-quinolinol)aluminum is suitably used. Moreover, since such an electron transporting layer or an electron injecting layer has a very thin film thickness, there is a little influence on the optical length of light.

The sealing substrate 20, for example, includes a glass substrate, but may include plastics, a laminated film of plastics, and laminated molding substrate other than the glass substrate, which are transparent and have excellent gas barrier property, or a laminated film of glasses. Further, a protective film may include a material capable of absorbing ultraviolet rays. Moreover, a drying agent 28 is arranged in a space covered with the sealing substrate 20.

The organic EL device 1 of the present embodiment is an active matrix type device. As described with reference to FIG. 5, on the transparent substrate 2, a plurality of data lines and a plurality of scanning lines are actually arranged in a lattice shape. To each pixel divided in a matrix by the data lines or the scanning lines, the organic EL element 3 is connected via a driving TFT 11 such as a switching transistor or a driving transistor. Further, if driving signals are supplied via the data lines or scanning lines, current flows between the electrodes, the light-emitting layer 6 of the organic EL element 3 emits light, and the light is emitted toward an outer surface of the transparent substrate 2, such that the pixel is turned on.

As shown in FIG. 5, in the active matrix type organic EL device 1, a plurality of scanning lines 131, a plurality of signal lines 132 extending in a direction orthogonal to the scanning lines 131, and a plurality of common supply lines 133 extending in a direction parallel to the signal lines 132 are provided. Further, at each intersection of the scanning lines 131 and the signal lines 132, a pixel (pixel region) 100 is provided.

With respect to the signal lines 132, a data line driving circuit 390 comprising a shift register, a level shifter, a video line and an analog switch is provided. Meanwhile, with respect to the scanning lines 131, a scanning line driving circuit 380 comprising a shift register and a level shifter is provided. Further, in each pixel region 100, a first transistor 322, which a scanning signal is supplied to a gate electrode via the scanning line 131, a storage capacitor 110 for storing an image signal to be supplied from the signal line 132 via the first transistor 322, a second transistor 324, which the image signal stored in the storage capacitor 110 is supplied to a gate electrode, a pixel electrode (anode) 4 electrically connected to the common supply line 133 via the second transistor 324 and into which a driving current flows from the common supply line 133, and a light-emitting layer 6 interposed between the pixel electrode 4 and the counter electrode (cathode) 7 are provided.

Based on such a construction, if the scanning line 131 is driven such that the first transistor 322 is turned on, a potential of the signal line 132 is stored in the storage capacitor 110, and according to the state of the storage capacitor 110, the conduction state of the second transistor 324 is determined. Further, a current flows from the common supply line 133 into the pixel electrode 4 via a channel of the second transistor 324, and a current flows into the counter electrode 7 via the light-emitting layer 6. As a result, the light-emitting layer 6 emits light according to the amount of the current flowing therethrough.

[Manufacturing Method of Organic EL Device]

A method of manufacturing the organic EL device 1 of the present embodiment comprises, first, a light-transmitting-layer forming step of forming the light-transmitting layer 13 having a refractive index larger than a refractive index of the transparent substrate 2 on the transparent substrate 2 using a semiconductor process, an organic-functional-layer forming step of forming the organic functional layer corresponding to each light-emitting element on the light-transmitting layer, and a counter-electrode forming step of forming the cathode 7 with a light reflectance material on the upper layer of the organic functional layer using a semiconductor process, such that the minute optical resonator between the cathode 7 and the light-transmitting layer 13 is formed.

In the light-transmitting-layer forming step, the light-transmitting layer 13 is formed with the first insulating layer 10a and the anode 4. Alternately, the light-transmitting layer 13 may be formed only with the anode 4. In any cases, the light-transmitting layer 13 is formed such that the third optical length La3, which is the product of film thickness d1 and refractive index n1 of the light-transmitting layer 13, is 300 nm or less.

In the organic-functional-layer forming step, with respect to the regions at which the green light-emitting elements are formed, the hole injecting layer 5 and the light-emitting layer 6 are formed such that the first optical length La1, which is the sum of the product of film thickness d2 and refractive index n4 of the hole injecting layer 5 and the product of film thickness d3 and refractive index n3 of the light-emitting layer 6, is 250 nm or less, by using the liquid droplet discharging method described below. Further, with respect to the regions at which the blue light-emitting elements are formed, the hole injecting layer 5 and the light-emitting layer 6 are formed such that the second optical length La2, which is the sum of the product of film thickness d2 and refractive index n4 of the hole injecting layer 5 and the product of film thickness d3 and refractive index n3 of the light-emitting layer 6, is 230 nm or less.

In the present embodiment, it is preferable to form the hole injecting layer 5 and the light-emitting layer 6 by means of the liquid droplet discharging method (an ink jet method). When forming the organic functional layer by the liquid droplet discharging method, a bank 22 having an opening portion 21 is formed in a region at which the organic functional layer is formed. And then, a liquid material including a forming material of the organic functional layer is discharged from a discharging head of a liquid droplet discharging device to the opening portion 21 of the bank 22. As a result, the functional layer is formed in a predetermined position.

Here, the discharging head of the liquid droplet discharging device comprises an inkjet head. The ink jet method may includes a piezo jet method in which a liquid is discharged by changing the volume of a piezoelectric element, or a method in which an electrothermal converter is used for an energy generating element. Moreover, the liquid droplet discharging device may include a dispenser. Further, the liquid material refers to a medium having an enough viscosity to be discharged from a nozzle of the discharging head, irrespective of watery or oily nature. It is necessary to have liquidity (viscosity) capable of being discharged from the nozzle or the like, and to prepare a liquid having mixed with a solid material. Specifically, the solid material to be contained in the liquid material may be melted by heating above the melting point, or may be distributed in a solvent as particles. In addition, functional materials such as dyes or pigments other than the solvent may be added.

Moreover, in a specific example of the organic EL device, as the forming materials for the respective layers, various materials are exemplified, but it is natural that the materials of the anode 4 and the first insulating layer 10a are selected such that the anode 4 and the first insulating layer 10a have almost the same refractive index, and the materials of the transparent substrate 2 and the second insulating layer 10b are selected such that the transparent substrate 2 and the second insulating layer 10b have almost the same refractive index.

[Electronic Apparatus]

Figure 6:
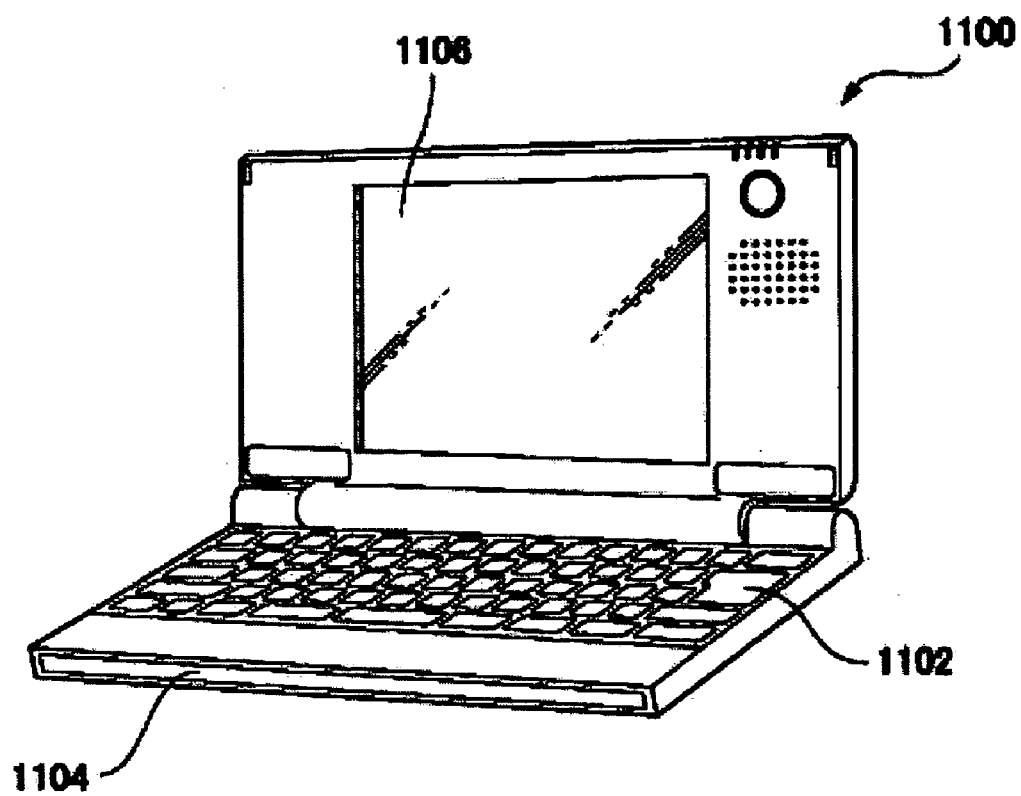
FIG. 6 is a view showing an example of an electronic apparatus comprising an organic EL device of the present embodiment.

Next, an example of an electronic apparatus comprising the above-mentioned organic EL device will be described. FIG. 6 is a perspective view showing a construction of a portable personal computer (information processing device) comprising a display device according to the above-mentioned embodiments. In FIG. 6, the personal computer 1100 comprises a main body 1104 comprising a keyboard 1102, and a display device unit comprising the above-mentioned organic EL device as a display device 1106. For this reason, it is possible to provide an electronic apparatus comprising a display unit having a wide color display range.

Moreover, in addition to the above-mentioned example, other examples may include a cellular phone, a wristwatch type electronic apparatus, a liquid crystal television, a view finder type or monitor-direct-view type videotape recorder, a vehicle navigation device, a pager, an electronic organizer, an electronic calculator, a word processor, a workstation, a videophone, a POS terminal, an electronic paper, and apparatuses equipped with a touch panel. The electro-optical device can also be applied as a display unit of such an electronic apparatus.

[Other Embodiment]

As described above, the preferred embodiments of the organic EL device, the manufacturing method thereof, and the electronic apparatus has been described with reference to the attached drawings, but it is needless to say that the present invention is not limited to the above-mentioned embodiments. The shapes or combinations of the respective elements shown in the respective embodiments are just examples, and can be variously modified based on the design demands without departing from the spirit and scope of the present invention.

What is claimed is:

1. An organic electroluminescent (EL) device which includes a plurality of light-emitting elements comprising:
   a light-transmitting layer including a transparent electrode, a first insulating layer having a refractive index about equal to that of the transparent electrode,
   a counter electrode having an optical reflectance; and
   an organic functional layer including a hole injecting layer and a light-emitting layer disposed between the light-transmitting layer and the counter electrode;
   wherein in green light-emitting elements among the plurality of light-emitting elements, a first optical length, which is the sum of the product of film thickness and refractive index of the hole injecting layer and the product of film thickness and refractive index of the light-emitting layer, is 250 nm or less,
   in blue light-emitting elements, a second optical length, which is the sum of the product of film thickness and refractive index of the hole injecting layer and the product of film thickness and refractive index of the light-emitting layer, is 230 nm or less, and
   the light-transmitting layer has a refractive index larger than the refractive index of the transparent substrate, and a third optical length, which is the product of film thickness and refractive index of the light-transmitting layer, is 300 nm or less.

2. The organic EL device according to claim 1, wherein the plurality of light-emitting elements include red light-emitting elements.

3. A method of manufacturing an organic EL device which includes a plurality of light-emitting elements, the method comprising:
   a light-transmitting-layer forming step of forming a light-transmitting layer;
   an organic-functional-layer forming step of forming, on the light-transmitting layer, a functional layer so as to correspond to each light-emitting layer; and
   a counter-electrode forming step of forming a counter electrode made of a light-reflective material on the organic functional layer,
   wherein the light-transmitting-layer forming step comprises a process of forming a first insulating layer having a refractive index about equal to that of the transparent electrode between a transparent substrate and the transparent electrode,
   in the organic-functional-layer forming step,
   in regions where green light-emitting elements are formed, a hole injecting layer and a light-emitting layer are formed such that a first optical length, which is the sum of the product of film thickness and refractive index of the hole injecting layer and the product of film thickness and refractive index of the light-emitting layer, is 250 nm or less,
   in regions where blue light-emitting elements are formed, a hole injecting layer and the light-emitting layer are formed such that a second optical length, which is the sum of the product of film thickness and refractive index of the hole injecting layer and the product of film thickness and refractive index of the light-emitting layer, is 230 nm or less, and
   in the light-transmitting-layer forming step, the light-transmitting layer is made of a material haying a refractive index larger than the refractive index of the transparent substrate and is formed such that a third optical length, which is the product of film thickness and refractive index of the light-transmitting layer, is 300 nm or less.

4. The method of manufacturing an organic EL device according to claim 3, wherein in the organic-functional-layer forming step, the hole injecting layer and the light-emitting layer are formed by using a liquid droplet discharging method.

* * * * *